(12) United States Patent
Sun et al.

(10) Patent No.: US 11,515,377 B2
(45) Date of Patent: Nov. 29, 2022

(54) DISPLAY PANEL WITH A LIGHT-BLOCKING LAYER

(71) Applicants: Chengdu BOE Optoelectronics Technology Co., Ltd., Chengdu (CN); BOE Technology Group Co., Ltd., Beijing (CN)

(72) Inventors: Kuo Sun, Beijing (CN); Hai Zheng, Beijing (CN); Jianxiong Huang, Beijing (CN); Guodong Liu, Beijing (CN)

(73) Assignees: Chengdu BOE Optoelectronics Technology Co., Ltd., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 349 days.

(21) Appl. No.: 16/492,935

(22) PCT Filed: Jan. 24, 2019

(86) PCT No.: PCT/CN2019/072955
§ 371 (c)(1),
(2) Date: Sep. 10, 2019

(87) PCT Pub. No.: WO2020/057036
PCT Pub. Date: Mar. 26, 2020

(65) Prior Publication Data
US 2021/0327990 A1 Oct. 21, 2021

(30) Foreign Application Priority Data
Sep. 21, 2018 (CN) .......................... 201811109599.7

(51) Int. Cl.
*H01L 27/32* (2006.01)
*H01L 51/52* (2006.01)
*G06V 40/13* (2022.01)

(52) U.S. Cl.
CPC ...... *H01L 27/3272* (2013.01); *G06V 40/1318* (2022.01); *H01L 27/3234* (2013.01);
(Continued)

(58) Field of Classification Search
None
See application file for complete search history.

(56) References Cited

U.S. PATENT DOCUMENTS

2003/0116768 A1* 6/2003 Ishikawa ............. H01L 27/1255
257/E27.113
2007/0241332 A1 10/2007 Ochiai et al.
(Continued)

FOREIGN PATENT DOCUMENTS

| CN | 106298859 A | 1/2017 |
| CN | 107977632 A | 5/2018 |

(Continued)

OTHER PUBLICATIONS

First office action in corresponding CN201811109599.7.
(Continued)

*Primary Examiner* — Aaron J Gray
(74) *Attorney, Agent, or Firm* — IPro, PLLC

(57) ABSTRACT

Disclosed herein is a display panel, comprising: a support; a first layer comprising a light emitter, a first region and a second region; a second layer sandwiched between the first layer and the support; wherein the first region and the second region allow light scattered by an object (e.g., a person's finger) to transmit therethrough; wherein the second layer allows light transmitted through the first region to reach the support and comprises a light-blocking layer configured to attenuate light transmitted through the second region.

15 Claims, 4 Drawing Sheets

(52) U.S. Cl.
CPC ...... *H01L 27/3258* (2013.01); *H01L 51/5284* (2013.01); *H01L 27/3246* (2013.01)

(56) References Cited

U.S. PATENT DOCUMENTS

| | | | |
|---|---|---|---|
| 2010/0134397 A1* | 6/2010 | Ishitani | H01L 27/1248 345/92 |
| 2019/0051709 A1* | 2/2019 | Puszka | H01L 27/3227 |
| 2019/0122025 A1* | 4/2019 | Gove | G06V 40/1382 |
| 2019/0156097 A1 | 5/2019 | Liu et al. | |
| 2019/0172887 A1 | 6/2019 | Sun et al. | |
| 2019/0220644 A1 | 7/2019 | Sun et al. | |

FOREIGN PATENT DOCUMENTS

| | | | |
|---|---|---|---|
| CN | 108242462 A | 7/2018 | |
| CN | 108335631 A | 7/2018 | |
| WO | WO-2018113207 A1 * | 6/2018 | G06K 9/0004 |

OTHER PUBLICATIONS

First office action in corresponding CN201811109599.7 (English translation).
SR in PCTCN2019072955.

\* cited by examiner

DISPLAY PANEL WITH A LIGHT-BLOCKING LAYER

TECHNICAL FIELD

The disclosure herein relates to the field of display technology, and in particular, to a display panel.

BACKGROUND

With development of the display technology, fingerprint recognition has been gradually becoming one of the necessities for display products. To develop full-screen display products (i.e., with narrow bezels or no bezels) with fingerprint recognition capabilities, many manufacturers endeavor to achieve on-screen fingerprint recognition.

SUMMARY

Disclosed herein is a display panel, comprising: a support; a first layer comprising a light emitter, a first region and a second region; a second layer sandwiched between the first layer and the support; wherein the first region and the second region allow light scattered by an object to transmit therethrough; wherein the second layer allows light transmitted through the first region to reach the support and comprises a light-blocking layer configured to attenuate light transmitted through the second region.

According to an embodiment, the light emitter comprises a material that exhibits electroluminescence (EL).

According to an embodiment, the second layer comprises a thin-film transistor (TFT).

According to an embodiment, the light-blocking layer is an interlayer dielectric (ILD) of the TFT.

According to an embodiment, the second layer comprises a planarization layer on the TFT and distal from the support; wherein the planarization layer comprises the light-blocking layer.

According to an embodiment, the light-blocking layer comprises a polyimide configured to attenuate the light transmitted through the second region.

According to an embodiment, the display panel further comprises a passivation layer.

According to an embodiment, the display panel further comprises an image sensor.

According to an embodiment, the image sensor is sandwiched between the support and the second layer, or the support is sandwiched between the image sensor and the second layer.

According to an embodiment, the display panel further comprises a window; the window extends through the light-blocking layer; the window is optically aligned with the image sensor; and the window is optically coupled to the light transmitted through the first region.

According to an embodiment, the window comprises a dielectric.

According to an embodiment, the window comprises a void.

According to an embodiment, the light-blocking layer comprises a portion optically coupled to the light transmitted through the first region; wherein the portion has a greater thickness than the window.

According to an embodiment, the object is a person's finger.

Disclosed herein is an electronic system comprising any of the display panel above and a touch sensor.

DETAILED DESCRIPTION

Figure 1:
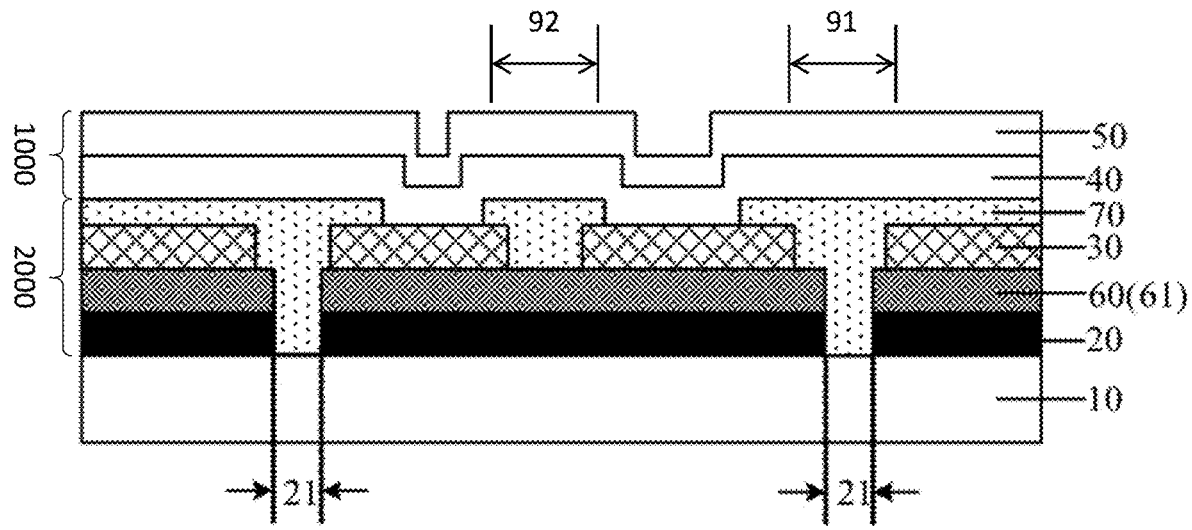
FIG. 1 shows a cross-sectional view of a display panel.

FIG. 1 shows a cross-sectional view of a display panel, according to an embodiment. The display panel includes a support 10, a first layer 1000 and a second layer 2000. The second layer 2000 is sandwiched between the first layer 1000 and the support 10. The first layer 1000 has a light emitter, which may include a functional organic material layer 40 with a material that exhibits electroluminescence (EL) and a cathode layer 50. Other suitable types of light emitters are possible. The second layer 2000 may include an anode layer 30, and a pixel delimiting layer 70 configured to separate the light emitter from other light emitters that may be present in the first layer 1000. The pixel delimiting layer 70 may be between the anode layer 30 and the functional organic material layer 40. The first layer 1000 has a first region 91 and a second region 92, both allowing light scattered by an object (e.g., a person's finger) to transmit through them.

The second layer 2000 allows light transmitted through the first region 91 to reach the support 10 (e.g., with at least 50% transmittance). The second layer 2000 attenuates light transmitted through the second region 92, with a light-blocking layer 60 in the second layer 2000. The second layer 2000 may include a pinhole layer 20 with patterns defining a pinhole 21, as in the example of FIG. 1. The pinhole 21 is not necessarily a physical hole of void space; instead it can include a window that allows at least some of the light transmitted through the first region 91 to pass through. The pinhole layer 20 may include a layer of material that is essentially opaque to the light from the object.

Figure 2A:
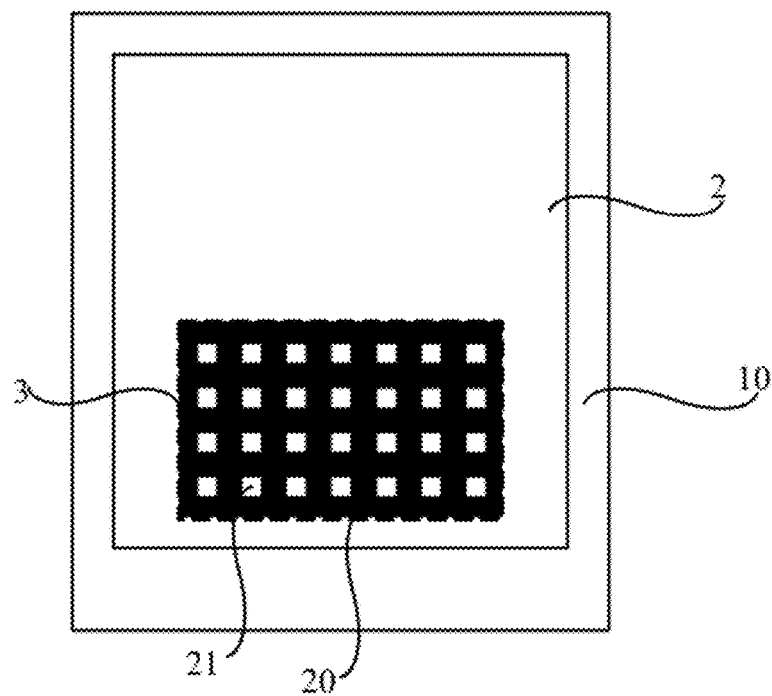
FIG. 2A and FIG. 2B show that a pinhole layer of the display panel may be present in at least a portion of the display region of the display panel.
Figure 2B:
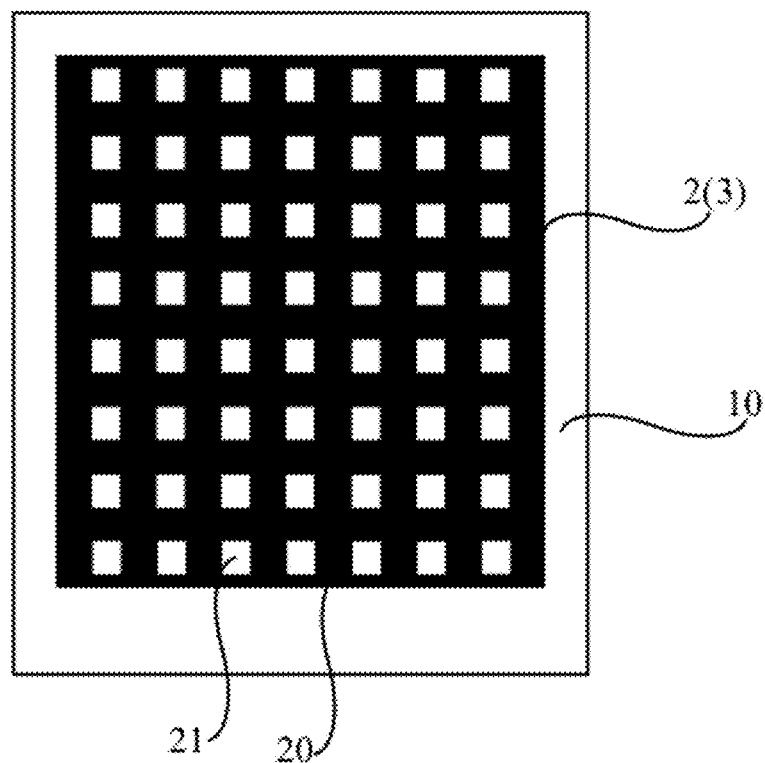

As shown in FIG. 2A and FIG. 2B, the pinhole layer 20 may be present in at least a portion (the fingerprint recognition region 3) of the display region 2 of the display panel. The pinhole layer 20 does not necessarily extend to the entirety of the display panel. The pinhole layer 20 may have a plurality of pinholes 21 arranged in the fingerprint recognition region 3. In the example in FIG. 2A, the fingerprint recognition region 3 occupies only a part of the display region 2. In the example in FIG. 2B, the fingerprint recognition region 3 occupies essentially all of the display region 2.

The combination of the first layer 1000 and the second layer 2000 in the fingerprint recognition region 3 may be partially or entirely not opaque to the light from the object. In other words, in the fingerprint recognition region 3, the anode layer 30, the light-blocking layer 60 and the pinhole layer 20, if present, include some windows not opaque to the light from the object.

If the pinhole layer 20 is present, the pinholes 21 may have a circular shape, a rectangular shape, a square shape, a diamond shape, a hexagon shape or any other suitable shapes. The pinholes 21 may be arranged in any suitable pattern such as a rectangular grid shown in FIG. 2A and FIG. 2B.

When the object presses on the display panel, light scattered from the object passes through the pinholes 21. The light scattered from the object may be emitted from the light emitter in the first layer 1000. The light scattered from the object forms an image of the object (e.g., an image of the friction ridges of a finger) on an image sensor on the support 10, based on the principle of pinhole cameras. The image sensor may be on either side of the support 10. Namely, the image sensor may be sandwiched between the support 10 and the second layer 2000, or the support 10 is sandwiched between the image sensor and the second layer 2000. The image sensor may identify patterns from the image of the friction ridges. The image sensor may be any suitable image sensor, such as a still camera or a video camera. The image sensor may be based on charge-coupled devices (CCD) or complementary metal-oxide-semiconductor (CMOS) devices. The image sensor may be a color image sensor, a grayscale image sensor or a black-and-white image sensor. The image sensor may have any suitable number of pixels and the pixels may be arranged in any suitable array (e.g., rectangular array, honeycomb array, triangular array).

Figure 3:
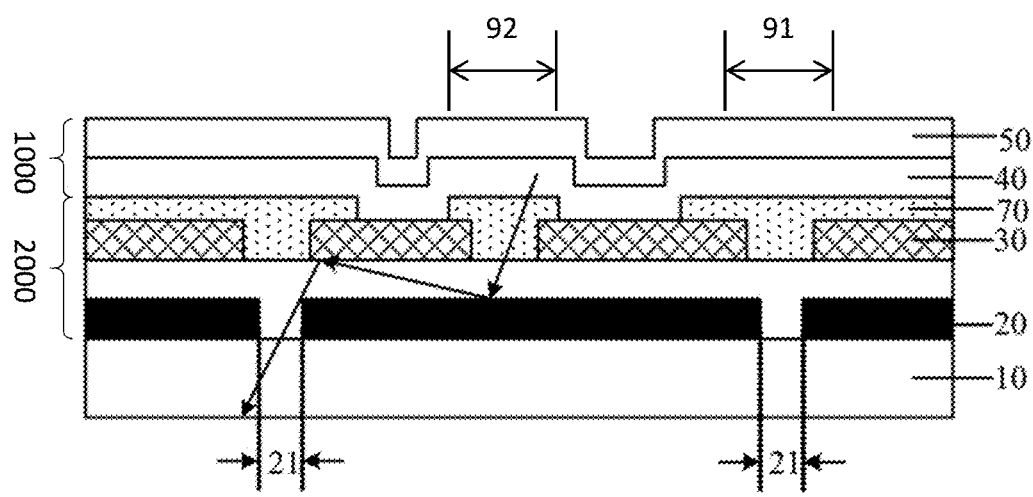
FIG. 3 shows that the anode layer of the display panel includes a first window in the first region and a second window in the second region.

As shown in FIG. 3, the anode layer 30 includes a first window in the first region 91 and a second window in the second region 92. The first region 91 also includes the pinhole 21. and the first window of the anode layer 30 and the pinhole 21 are aligned, if the pinhole layer 20 is present. The second region 92 does include the pinhole 21, if the pinhole layer 20 is present. Namely, the second window of the anode layer 30 is not aligned with the pinhole 21. The alignment of the first window of the anode layer 30 and the pinhole 21, if the pinhole layer 20 is present, makes it possible that at least a portion of the light scattered from the object and transmitted through the first region 91 can reach the support 10.

However, although the second window of the anode layer 30 is not aligned with the pinhole 21, if the pinhole layer 20 is present, a portion of the light transmitted through the second region 92 may still reach the support 10 due to scattering of the light by structures of the second layer 2000, without the light-blocking layer 60. For example, the light transmitted through the second region 92 may be reflected between the anode layer 30 and the pinhole layer 20 and eventually reach the support 10 through the pinhole 21. The light transmitted through the second region 92 thus may adversely affect the quality of the image of the friction ridges formed on the image sensor and adversely affect the fingerprint recognition.

As described above, the light-blocking layer 60 is configured to attenuate light transmitted through the second region 92. The light-blocking layer 60 may have a transmittance of <50%, <20%, <10% or <5% for the light scattered by the object. The light-blocking layer 60 may include a material (e.g., polyimide) configured to attenuate light transmitted through the second region 92 by absorption. The light-blocking layer 60 may be configured to attenuate light transmitted through the second region 92 by scattering. The display panel may include a window that extends through the light-blocking layer 60 and is optically aligned with the image sensor and optically coupled to the light transmitted through the first region 91. The window may include a void or a dielectric.

The second layer 2000 may include structures such as a thin-film transistor (TFT) 11, in the examples shown in FIG. 4-FIG. 8. The light-blocking layer 60 may be an interlayer dielectric (ILD) of the TFT 11, according to an embodiment. The ILD may be between the layer with the source electrode and the drain electrode of the TFT 11 and the gate electrode of the TFT 11. The TFT 11 may be on the support 10. The pinhole layer 20, if present, and the light-blocking layer 60 may be both on the side of the TFT 11 distal from the support 10.

Figure 4:
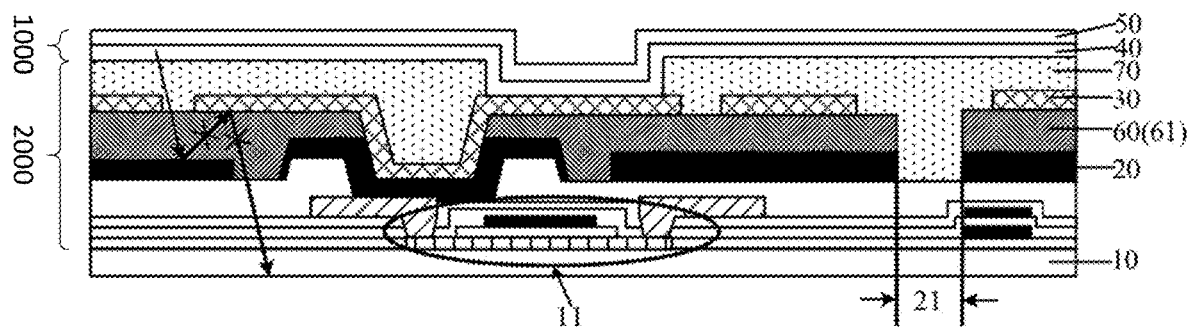
FIG. 4 schematically shows a cross-sectional view of the display panel, according to an embodiment.

FIG. 4 schematically shows a cross-sectional view of the display panel, according to an embodiment. The second layer 2000 includes a first planarization layer 61 on the TFT 11 and distal from the support 10. The first planarization layer 61 is between the TFT 11 and the anode layer 30, e.g., between the pinhole layer 20 and the anode layer 30. The light-blocking layer 60 may be a part or an entirety of the first planarization layer 61. Light transmitted through the second region 92 and then through the second window of the anode layer 30 reaches the light-blocking layer 60 and is attenuated by it.

Figure 5:
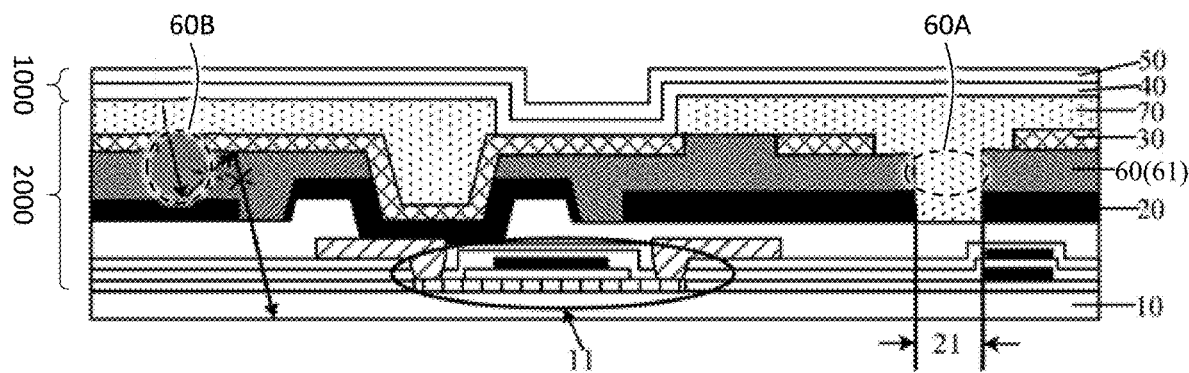
FIG. 5 schematically shows a cross-sectional view of the display panel, according to an embodiment.

FIG. 5 schematically shows a cross-sectional view of the display panel, according to an embodiment. The light-blocking layer 60 has a portion 60B optically coupled to the light transmitted through the second region 92. This portion 60B has a greater thickness than the window 60A that extends through the light-blocking layer 60 and is optically aligned with the image sensor and optically coupled to the light transmitted through the first region 91. The greater thickness of the portion 60B can enhance the attenuation of the light transmitted through the second region 92.

Figure 6:
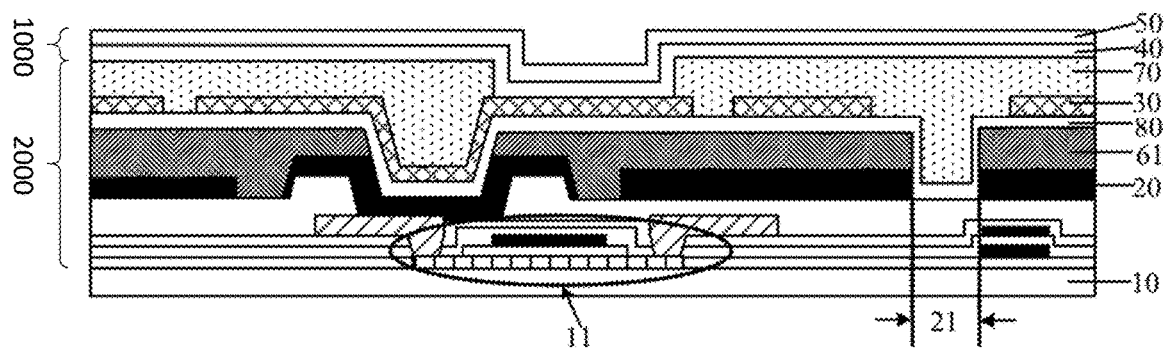
FIG. 6 schematically shows a cross-sectional view of the display panel, according to an embodiment.

FIG. 6 schematically shows a cross-sectional view of the display panel, according to an embodiment. The display panel may have a passivation layer 80 that separates the light-blocking layer 60 from the first layer 1000. For example, the passivation layer 80 may be on a side of the first planarization layer 61 facing away from the support 10 and between the first planarization layer 61 and the anode layer 30. The passivation layer 80 may block diffusion of moisture and oxygen from the light-blocking layer 60 into the light emitter in the first layer 1000.

Figure 7:
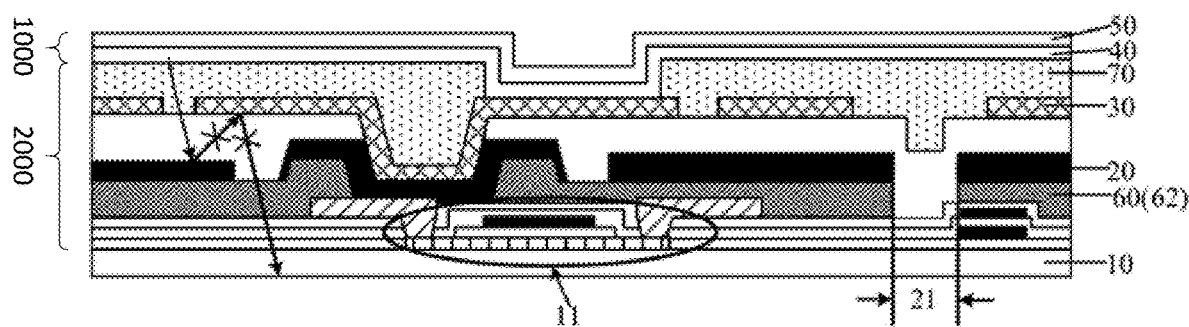
FIG. 7 schematically shows a cross-sectional view of the display panel, according to an embodiment.

FIG. 7 schematically shows a cross-sectional view of the display panel, according to an embodiment. The second layer 2000 includes a second planarization layer 62 on the TFT 11 and distal from the support 10. The second planarization layer 62 is between the TFT 11 and the anode layer 30, e.g., between the pinhole layer 20 and the TFT 11. The light-blocking layer 60 may be a part or an entirety of the second planarization layer 62. Light transmitted through the second region 92 and then through the second window of the anode layer 30 reaches the light-blocking layer 60 and is attenuated by it.

Figure 8:
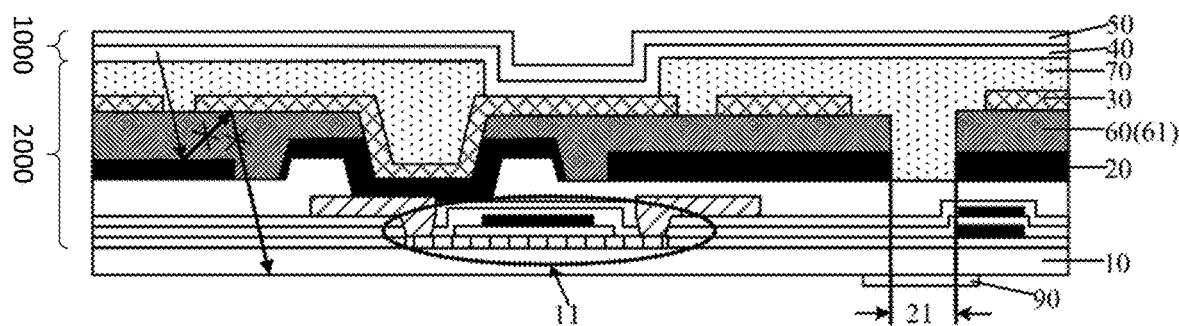
FIG. 8 shows that the display panel may include an image sensor.

FIG. 8 shows that the display panel may include the image sensor 90, in an embodiment. The image sensor 90 may be on either side of the support 10.

The support 10 may be a flexible support or a rigid support. As such, the display panel can be flexible or rigid. A flexible support may include polyimide, polycarbonate, polyethylene, polyethylene terephthalate, polyacrylate, any combination thereof, or any other suitable materials.

An electronic system (e.g., an e-book reader, a laptop computer, a computer monitor, a mobile phone, a tablet computer, a television, a display screen, a digital photo frame, or a portable GPS system) may encompass the display panel described herein and a touch sensor. For example, the touch sensor may be positioned on the side of the cathode layer 50 distal from the support 10. The touch sensor may be a self-capacitive touch sensor, a mutual capacitive touch sensor, or any other suitable touch sensor.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A display panel, comprising:
    a support;
        a first layer comprising a light emitter, a first region and a second region;
        a second layer sandwiched between the first layer and the support;
        wherein the first region and the second region allow light scattered by an object to transmit therethrough;
        wherein the second layer comprises an anode layer with a first window in the first region and a second window in the second region;
        wherein the second layer comprises a pinhole layer with patterns defining a pinhole;
        wherein the first window and the pinhole are aligned in a direction perpendicular to a surface of the support on which the second layer is formed;
        wherein the pinhole layer completely covers the second window in the direction perpendicular to a surface of the support on which the second layer is formed;
        wherein the second layer allows light transmitted through the first window to reach the support through the pinhole and comprises a light-blocking layer configured to attenuate light transmitted through the second window so that the light-blocking layer has a transmittance of <50% for the light transmitted through the second window.

2. The display panel of claim 1, wherein the light emitter comprises a material that exhibits electroluminescence (EL).

3. The display panel of claim 1, wherein the second layer comprises a thin-film transistor (TFT).

4. The display panel of claim 3, wherein the light-blocking layer is an interlayer dielectric (ILD) of the TFT.

5. The display panel of claim 3, wherein the second layer comprises a planarization layer on the TFT and distal from the support; wherein the planarization layer comprises the light-blocking layer.

6. The display panel of claim 1, wherein the light-blocking layer comprises a polyimide configured to attenuate the light transmitted through the second region.

7. The display panel of claim 1, further comprising a passivation layer.

8. The display panel of claim 1, further comprising an image sensor.

9. The display panel of claim 8, wherein the image sensor is sandwiched between the support and the second layer, or the support is sandwiched between the image sensor and the second layer.

10. The display panel of claim 8, further comprising a window extending through the light-blocking layer; wherein the window extending through the light-blocking layer is optically aligned with the image sensor; and wherein the window extending through the light-blocking layer is optically coupled to the light transmitted through the first window of the anode layer.

11. The display panel of claim 10, wherein the window extending through the light-blocking layer comprises a dielectric.

12. The display panel of claim 10, wherein the window extending through the light-blocking layer comprises a void.

13. The display panel of claim 10, wherein the light-blocking layer comprises a portion optically coupled to the light transmitted through the second region; wherein the portion has a greater thickness than the window.

14. The display panel of claim 1, wherein the object is a person's finger.

15. An electronic system comprising the display panel of claim 1, and a touch sensor.

* * * * *